United States Patent [19]

Kohmoto et al.

[11] Patent Number: 4,797,783
[45] Date of Patent: Jan. 10, 1989

[54] AIR COOLING EQUIPMENT FOR ELECTRONIC SYSTEMS

[75] Inventors: Mitsuo Kohmoto; Yohichi Matsuo, both of Tokyo, Japan

[73] Assignee: NEC Corporation, Tokyo, Japan

[21] Appl. No.: 106,891

[22] Filed: Oct. 13, 1987

Related U.S. Application Data

[63] Continuation of Ser. No. 780,496, Sep. 26, 1985, abandoned.

[30] Foreign Application Priority Data

Sep. 26, 1984 [JP] Japan .................. 59-199434
Oct. 4, 1984 [JP] Japan .................. 59-207135

[51] Int. Cl.⁴ .............................................. H05K 7/20
[52] U.S. Cl. .................................... 361/384; 361/381
[58] Field of Search ................... 165/80.3, 104.33; 174/16 R; 361/380–381, 383–384, 390, 415

[56] References Cited

U.S. PATENT DOCUMENTS

| | | |
|---|---|---|
| 2,412,989 | 12/1946 | Kotterman .................. 361/384 |
| 3,749,981 | 7/1973 | Koltuniak et al. ............ 361/384 |
| 3,895,215 | 7/1975 | Gordon ..................... 174/16 R |
| 4,158,875 | 6/1979 | Tajima et al. .............. 174/16 R |
| 4,386,651 | 6/1983 | Reinhard ..................... 361/384 |

OTHER PUBLICATIONS

Hammer et al., "Ventilation System for Data Processing Systems", IBM Technical Disclosure Bulletin, vol. 17, No. 9, 2/75 pp. 2529-2530.

Primary Examiner—A. D. Pellinen
Assistant Examiner—Gregory P. Thompson
Attorney, Agent, or Firm—Sughrue, Mion, Zinn, Macpeak & Seas

[57] ABSTRACT

An air cooling equipment for use in electronic systems having a plurality of wiring boards with a plurality of heat-generating electronic components mounted thereon is disclosed. The air cooling equipment uses two blowers positioned on top and bottom of the unit introduces cooling air in two directions into the housing. The blowers may be positioned at sides of the housing and air is directed around and through the zone where the wiring boards are disposed.

9 Claims, 5 Drawing Sheets

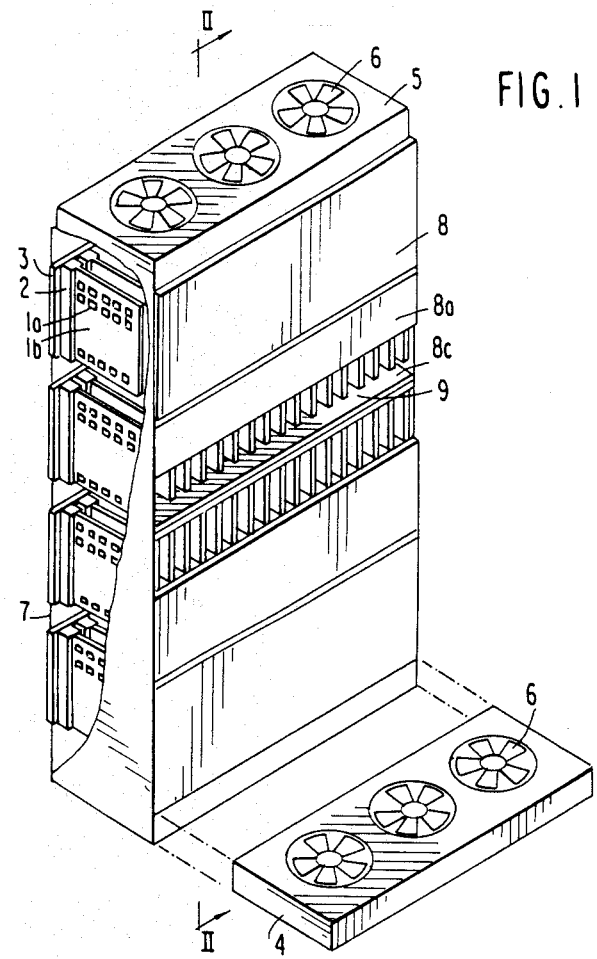
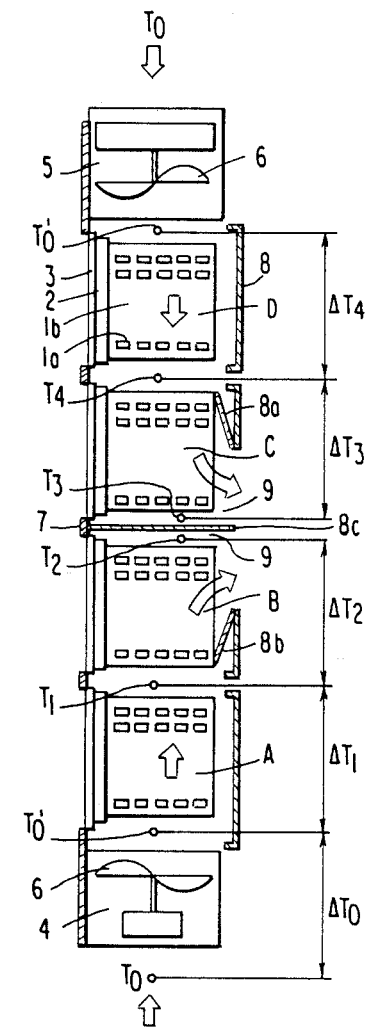
FIG. 1
FIG. 2

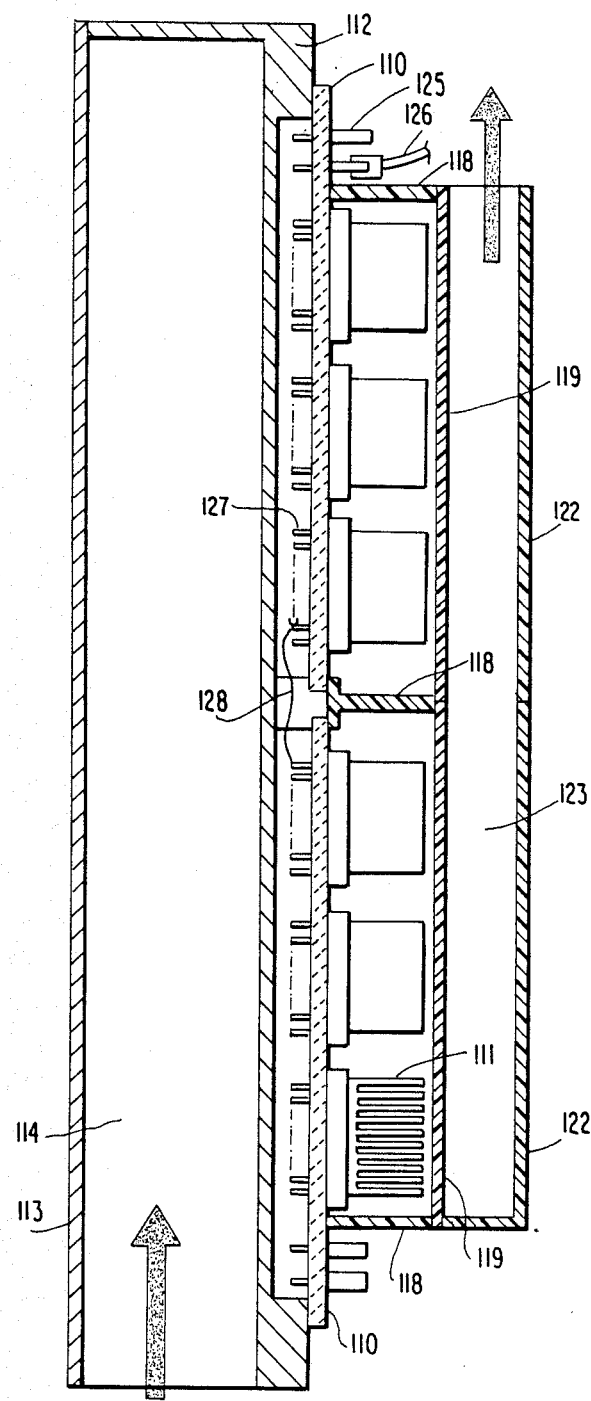

AIR COOLING EQUIPMENT FOR ELECTRONIC SYSTEMS

This is a continuation of Ser. No. 780,496, filed on Sept. 26, 1985 now abandoned.

BACKGROUND OF THE INVENTION

This invention relates to air cooling equipment for use in electronic systems such as communications systems and information processing systems.

In general, active elements such as transistors mounted on a printed circuit wiring board tend to generate heat proportional to the dissipated electric power. The heat produced has an adverse effect on characteristics of the active elements and, if too great, can result ultimately in the destruction of those active elements. For this reason, a strict environmental temperature restriction is imposed on these electronic components to ensure reliability. This temperature restriction is easily met in circuits using only a few active heat producing elements. However, recently, electronic systems need to concentrate a great number of active elements on a chip in a high density arrangement to achieve high speed operation and microminiaturization. Accordingly, an increase in the number of active elements is accompanied with the attendant increase of the electric power dissipation and the quantity of heat produced which must be dissipated. This is typically accomplished by means of cooling equipment for effectively cooling the electronic components to maintain the temperature of the electronic components below their maximum operating temperature.

One attempt for the practical use of such cooling equipment is disclosed in an air cooling system in U.S. Pat. No. 4,158,875. In the system described in that patent, a plurality of blowers are arranged with the edges of a plurality of wiring boards adjacent each other. Thus, the distance between elements connected to each other becomes longer. As a result, a high speed operation in such electric systems cannot be achieved. Furthermore, in order to obtain the air flow rate required to fully cool the electronic components, a bulky air blower is needed resulting in requiring a large area dedicated to intake and exhaust ducts. Accordingly, it is difficult operation to exchange the components for maintenance.

SUMMARY OF THE INVENTION

It is, therefore, an object of the present invention to provide cooling equipment free from the above-mentioned shortcomings in the prior art, such as the unacceptable distance between elements and the problem of difficult maintenance operations.

In accordance with this invention, in a first embodiment, a plurality of wiring boards has a plurality of heat-generating electric components mounted thereon. A first blower introduces a cooling air from the top of the equipment and a first air passage having intake ports and exhaust ports receives air from the first blower. A second blower introduces cooling air from the bottom of the equipment. A second air passage having intake ports and exhaust ports received the air from the second blower. A partition wall divides the first air passage from the second air passage.

In a second embodiment, the invention uses a plurality of wiring boards with a plurality of heat-generating electric components mounted thereon. An intake duct introduces cooling air from the bottom of the air cooling equipment into the housing. A blower moves the air from the intake duct into a path portion which receives through air from the blower. The path portion extends to the sides of the air cooling equipment. An exhaust duct exhausts air from the path portion to the top of the equipment.

BRIEF DESCRIPTION OF THE DRAWINGS

The present invention will be described in detail with reference to the accompanying drawings, in which:

FIGS. 1 and 2 are respectively a perspective view along line II—II in FIG. 1 and cross-sectional view of a first embodiment of the invention, FIGS. 3 to 6 are respectively a perspective front view, perspective back view and cross-sectional views along lines V—V and VI—VI in FIG. 3 of a second embodiment of the invention.

DESCRIPTION OF THE PREFERRED EMBODIMENTS

Figure 3:
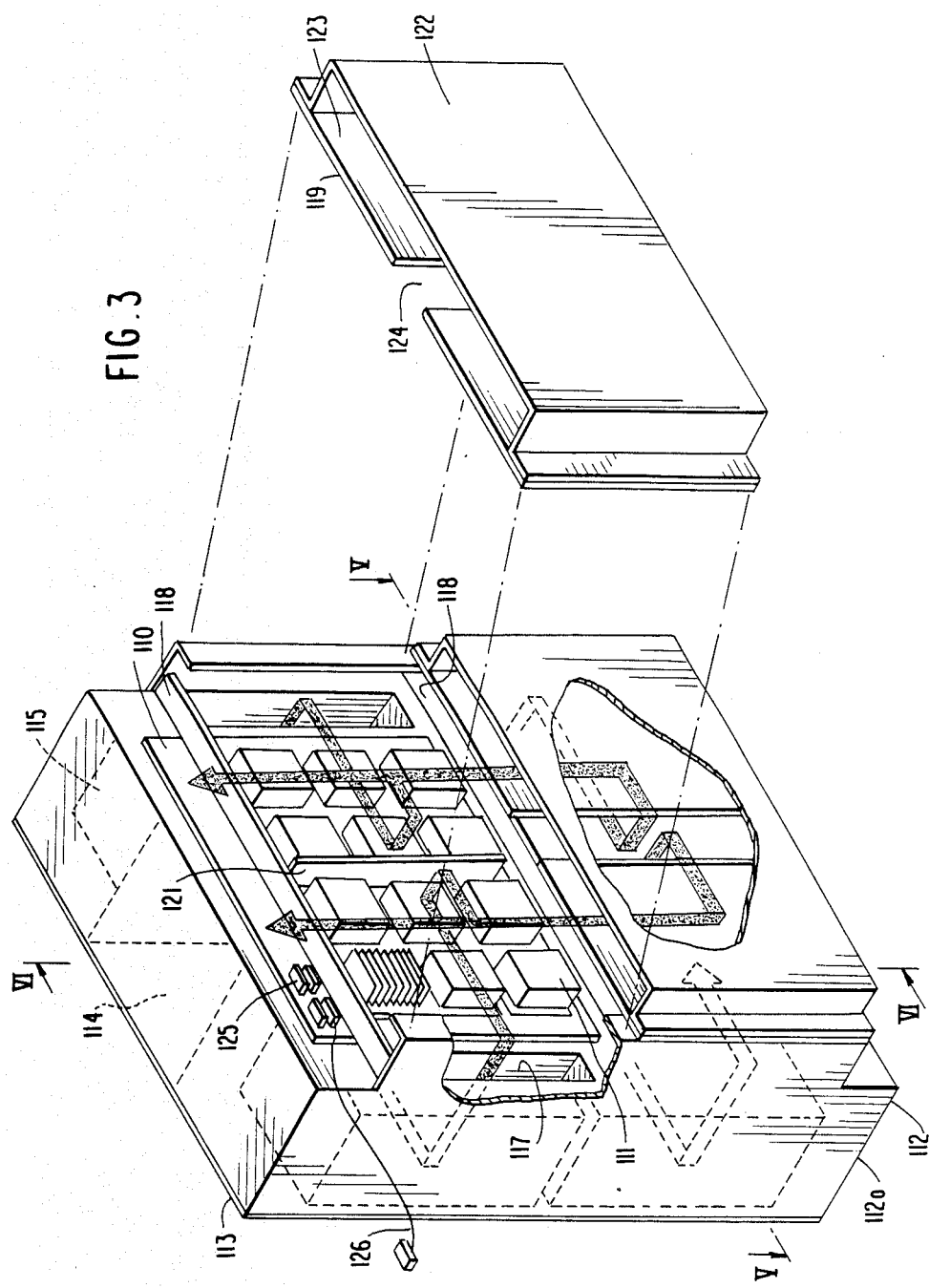

Throughout the drawings, arrows denote the direction of air flow passing through a duct or a flow path. Referring now to FIGS. 1 and 2, a first embodiment according to the present invention has an array of daughter wiring boards $1b$ each comprising a plurality of components $1a$, mother boards 3 having, the daughter wiring boards $1b$ inserted thereon, and connectors 2 for connecting daughter wiring boards $1b$ to mother boards 3. Supports 7 support a plurality of mother boards 3 of the array. An upper intake unit 5 with blowers 6 is mounted in the upper position of the equipment relative to the boards $1b$ and 3, connectors 2, and supports 7. A lower intake unit 4 with blowers 6 is mounted in the lower position relative to the array of boards $1b$ and 3, connectors 2, and supports 7. Covers 8 are fixed to the supports 7 by inwardly extending flanges and have exhaust ports 9. A divider plate $8c$ fixed to the appropriate inner wall portion of the supports 7 separates the air flow paths from the respective blowers to prevent mixing of the air flow from the upper portion into the lower portion and also prevent mixing of the air flow from the lower portion into the upper portion. This is illustrated in FIG. 2 which is a sectional view along line II—II of FIG. 1. Guide plates $8a$ and $8b$ fixed to the cover 8 direct the warmed air in the flow path to ambient exhaust.

The air flow paths in FIG. 2 will now be explained. FIG. 2 illustrates temperatures in various zones by $T_0$, $T_0'$, $T_1$, $T_2$, $T_3$, and $T_4$. The differentials are given by $\Delta T_1$, $\Delta T_2$, $\Delta T_3$, and $\Delta T_4$. Cool air from the lower position of the equipment is introduced by the blowers 6 of the unit 4. Next, the cooling air passes through at the position (A) in the direction of the arrow and cools the lower mounted electric components $1a$ mounted on the daughter wiring boards $1b$. Then, the air warmed by the heat produced from the electric components $1a$ is delivered from position (B) into the exhaust port by guide of the guide plate $8b$. In a parallel manner, cooling air from the upper position of this equipment is introduced by the blowers 6 of the unit 5. The air flow passes through position (D) in the direction of an arrow and cools the upper electronic components $1a$ mounted on the daughter wiring boards $1b$. Then, the air warmed by the heat produced from the upper electric components $1a$ is delivered from the position (C) into the exhaust port 9 by guide of the guide plate $8a$.

Figure 4:
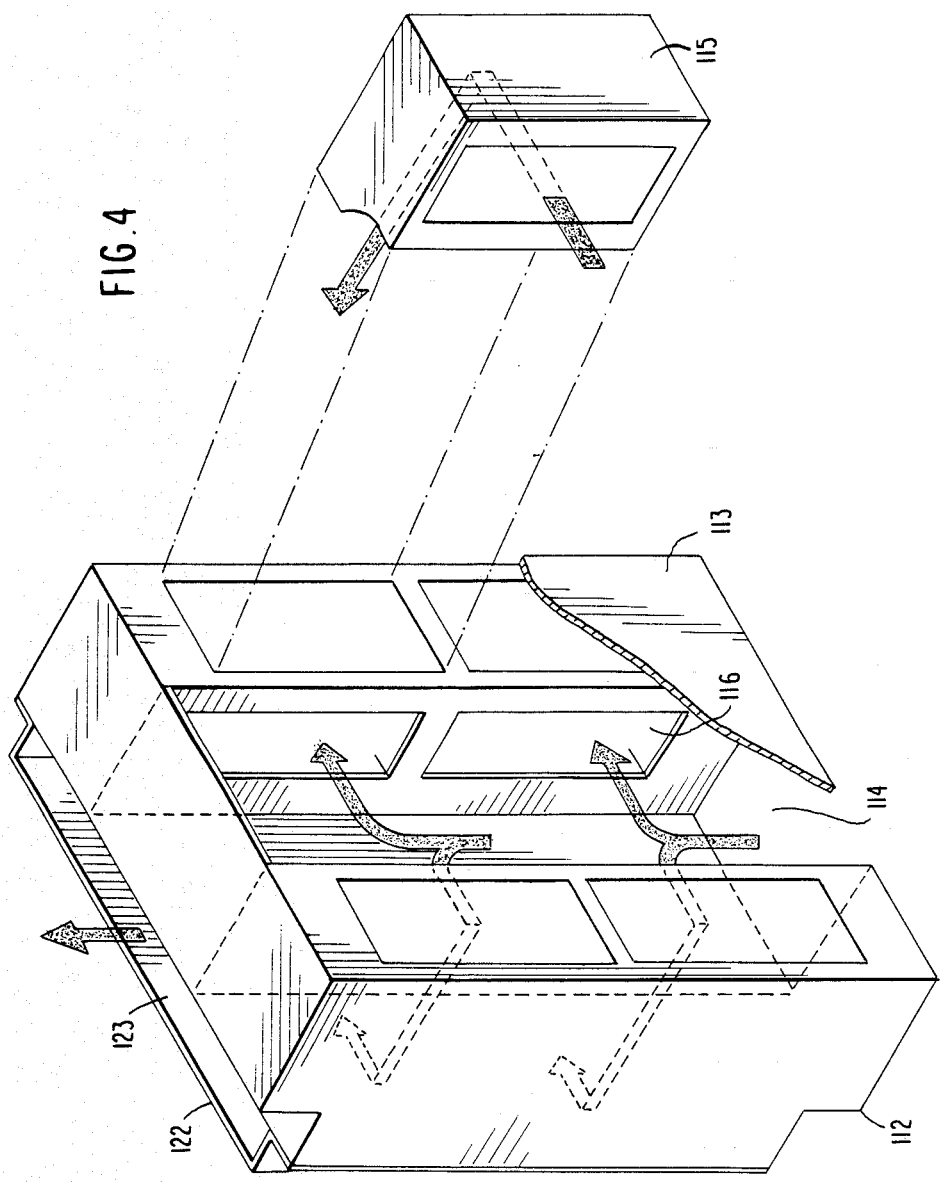
Figure 5:
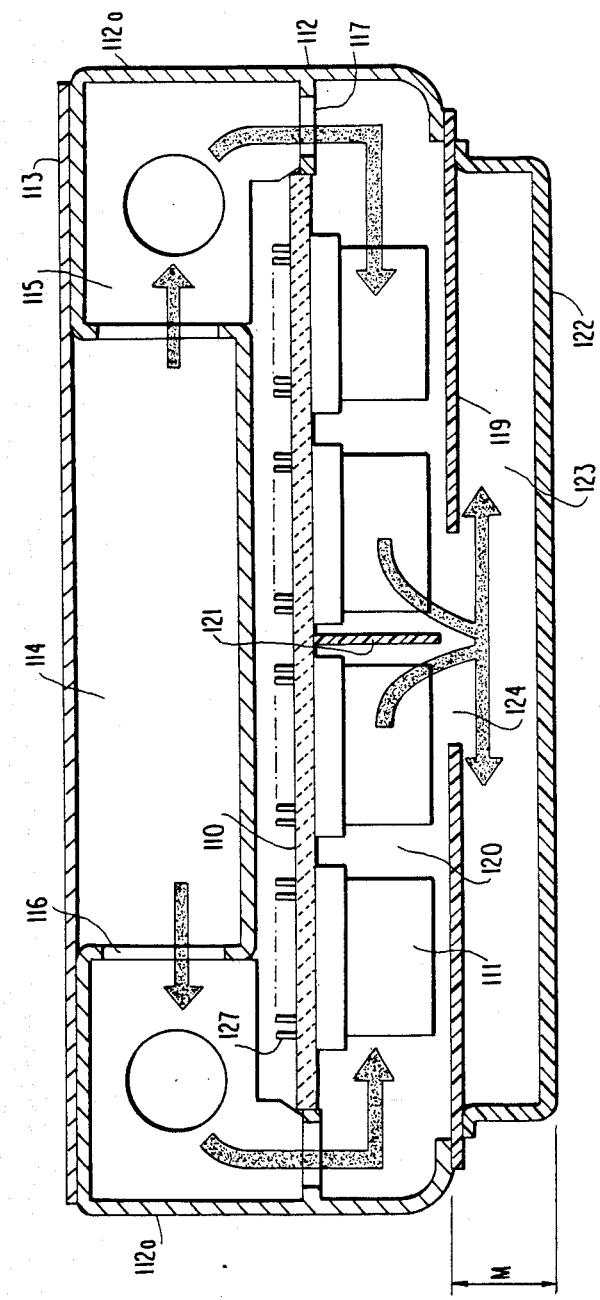

A second embodiment according to the present invention will be explained with reference to FIGS. 3 to 6. FIGS. 3 and 4 are perspective front and rear views of the second embodiment. FIGS. 5 and 6 are two sectional views taken respectively along lines V—V and VI—VI in FIG. 3. Referring to FIGS. 3 to 6, a large number of electrical components 111 are mounted on each of the wiring boards 110. The components 111 are the heat generating elements. The wiring boards 110 are fixed to a frame 112 which has a larger front shape than that of the board 111, and has a sleeve portion 112a. A front cover 113 is fixed to the sleeve portion 112a, so that an intake duct 114 is formed by the frame 112 and the cover 113. A plurality of blowers are fixed to the sleeve portion 112a, and are located beside the intake duct 114. The intake portions of the blowers are connected to an inlet portion 116 of the sleeve portion 112a and the exhaust portions of the blowers are connected to a conduit path 117 of the frame 112. The conduit path 117 is rectangular in shape when viewed in cross-section. The blowers move cooling air into and through the inlet portion 116 and exhaust cooling air to the wiring boards 110 through the conduit path 117. Seal plates 118 fixed to the wiring boards 110 and an inner cover 119 fixed to the frame 112 enclose the wiring board 110 and the conduit path 117. A path 120 (illustrated in the horizontal cross-sectional view FIG. 5) is formed which guides the cooling air in horizontal direction on the back sides along the mounting surface of the wiring boards 110 from the conduit path 117.

The path 120 is divided into two parts by a vertical separator plate 121 in the central portion of the path 120. Two outer rear covers 122 have a U-shape, and include the inner cover 119 joined together by flange portions, so that an exhaust duct 123 having a duct width $\underline{M}$ (FIG. 5) is formed by the combined outer covers $\overline{122}$ and the inner cover 119. The lower portion of the exhaust duct 123 is sealed and the upper portion of the exhaust duct 123 is open. The air warmed by the heat produced from the component array 111 is delivered from the path 120 into the exhaust duct 123 via an outlet portion 124. FIG. 6 also illustrates cable connectors 125 fixed to the wiring boards 110, and connect the wiring boards mounted on other equipment through signal cable 126. Wire lines 128 connect signal pins 127 mounted the wiring boards in the same equipment. Those components are also subjected to cooling air due to eddies and convection currents. The air flow passing through duct will now be explained. The cooling air introduced through the intake duct 114 flows in the direction of the arrow from the blower 115 into the zones 120 between components 111 and through the conduit path 117. The cooling air passing through the path 120 in the direction of an arrow cools the components 111 mounted on the wiring boards 110. The air warmed by the heat produced from the components 111 is delivered from the zones 120 into the exhaust duct 123 through the outlet portion 124.

Referring to vertical cross-sectional view FIG. 6, since air in the exhaust duct 123 has been warmed, the air will naturally rise and be discharged through the exhaust duct 123 in the direction of top arrow. In this second embodiment, the blowers 115 are not positioned on the side of the frame 112 and the shape of the conduit path 117 is a rectangle in the perpendicular direction, so that the location of the wiring boards can be close to each other. Accordingly, the distance between one component and another component is reduced more than that of the prior art.

The area of the exhaust duct is larger than that of ducts used in prior art devices such as in U.S. Pat. No. 4,158,875.

What is claimed is:

1. Air cooling equipment housing having therein a plurality of wiring boards with a plurality of heat generating electric components mounted thereon, said air cooling equipment housing comprising:
   first blower means introducing cooling air from top of the housing;
   first air passage means having an intake port, an air passage over at least one of said plurality of wiring boards and an exhaust port, said first air passage means passing the air from said first blower over said one of said plurality of boards wiring and exhausting it;
   second blower means introducing cooling air from bottom of the housing;
   second air passage means having an intake port, an air passage over at least a second of said plurality of wiring boards and an exhaust port, said second air passage means passing the air from said second blower over said second of said plurality of boards and exhausting it; and
   a partition wall separating said first air passage means and said second air passage means.

2. The equipment housing of claim 1 wherein said plurality of wiring boards are mounted in parallel rows on a mother board, said housing containing a plurality of mother boards and, said partition wall positioned between two of said plurality of mother boards.

3. The equipment housing of claim 2 further comprising cover means disposed on a side of said housing, said exhaust ports being positioned on opposite sides of said partition wall, guide plate means directing air to said exhaust ports, wherein air introduced from the top and bottom of said housing circulated around said heat-generating elements and exhausts on opposite sides of said partition wall through said exhaust ports.

4. Air cooling equipment housing having therein a plurality of wiring boards with a plurality of heat generating electric components mounted thereon, said air cooling equipment housing comprising:
   intake duct means introducing cooling air from a bottom of said housing;
   blower means receiving air from said intake duct means;
   first and second conduit path means passing air from said blower means, said first and second conduit path means being located respectively on sides of the housing;
   air guide means directing air from said first and second conduit path means across said heat generating components; and
   exhaust duct means exhausting air from said air guide means at top part of said housing.

5. The equipment housing of claim 2 wherein said wiring boards having said conduit path means on each side thereof; a vertical disposed separation plate positioned between said heat generating components wherein air circulating from one of said conduit path means into said heat generating components does not mix with air circulating from the other of said conduit path means.

6. The equipment housing of claim 2 wherein said blower means comprises first and second blowers positioned in said housing at opposite sides of said intake duct means and, said conduit path means comprises first and second conduits that receive air from said blowers and direct it toward said heat generating components.

7. The equipment housing of claim 2 further comprising a first outer cover, said first outer cover attached to said housing, said exhaust duct being located in said first outer cover and said air guide means separating said heat generating components from said exhaust duct.

8. The equipment housing of claim 7 further comprising a horizontally disposed separation plate in said housing, a second outer cover, said first outer cover mounted on one side of said separation plate and said second outer cover mounted on the other side thereof.

9. The equipment housing of claim 7 wherein said first outer cover is joined to said air guide means, said air guide means comprising a separating wall having a vertically oriented channel providing communication to said exhaust duct.

* * * * *